United States Patent
Onoue et al.

(10) Patent No.: US 6,444,893 B1
(45) Date of Patent: Sep. 3, 2002

(54) HIGH-CONVERTING EFFICIENCY LARGE-MECHANICAL STRENGTH THERMOELECTRIC MODULE

(75) Inventors: Katsuhiko Onoue; Toshiharu Hoshi, both of Shizuoka (JP)

(73) Assignee: Yamaha Corporation (JP)

( * ) Notice: Subject to any disclaimer, the term of this patent is extended or adjusted under 35 U.S.C. 154(b) by 0 days.

(21) Appl. No.: 09/593,019

(22) Filed: Jun. 13, 2000

(30) Foreign Application Priority Data

Jun. 15, 1999 (JP) ............................................ 11-169015

(51) Int. Cl.$^7$ .............................................. H01L 35/34
(52) U.S. Cl. ....................................................... 136/203
(58) Field of Search .................................. 136/203, 205

(56) References Cited

U.S. PATENT DOCUMENTS 5,763,293 A    6/1998   Yamashita et al. ............. 438/55

FOREIGN PATENT DOCUMENTS

JP    11-135843    5/1999

OTHER PUBLICATIONS

Fluerial, J. P.; Caillat, T.; and Borshchevsky, A.; Skutterudites: An Update, pp. 1–11, 16th Internation Conference on Thermoelectrics, 1997.*

CRC Handbook of Thermoelectric, Chap. 38, pp. 479–488; Chap. 46, pp. 597–607; and Chap. 49. pp. 621–631, 1995, CRC Press, Inc., D.M. Rowe (ed.).*

* cited by examiner

Primary Examiner—Bruce F. Bell
Assistant Examiner—Thomas H. Parsons
(74) Attorney, Agent, or Firm—Dickstein, Shapiro, Morin & Oshinsky, LLP.

(57) ABSTRACT

A thermoelectric module includes n-type semiconductor columns and p-type semiconductor columns connected in series through metal electrodes formed on inner surfaces of a pair of electrically insulating substrates, and the semiconductor columns are arranged so dense that the total cross sections of the semiconductor columns occupy at least 42 percent of one of the inner surfaces, whereby the converting efficiency is improved by virtue of restriction of the convective heat transfer between the electrically insulating substrates.

12 Claims, 2 Drawing Sheets

HIGH-CONVERTING EFFICIENCY LARGE-MECHANICAL STRENGTH THERMOELECTRIC MODULE

BACKGROUND OF THE INVENTION

1. Field of the Invention

This invention relates to a thermoelectric module such as, for example, a Peltier module.

2. Description of the Related Art

The thermoelectric effects are phenomena that occur between electric energy and temperature. The Peltier effect is one of the thermoelectric effects, and the Peltier junctions convert electric current to temperature differences. A Peltier module includes plural Peltier junctions, and electric current flows through the plural Peltier junctions so as to produce the temperature differences. Thus, the Peltier module is a sort of thermoelectric module.

A typical example of a thermoelectric module such as the Peltier module includes a pair of electrically insulating substrates opposed to each other, and metal electrodes are formed on the inner surfaces of the electrically insulating substrates. The metal electrodes are spaced from one another on each inner surface, and, accordingly, are electrically isolated by the electrically insulating substrate. The metal electrodes on one inner surface are offset from the metal electrodes of the other inner surface, and p-type semiconductor columns and n-type semiconductor columns are alternately connected between the metal electrodes on one inner surface and the metal electrodes on the other inner surface. Thus, the junctions between the metal and the p-type semiconductor are alternated with the junctions between the metal and the n-type semiconductor in the electric current path.

While electric current is flowing through the electric current path, the electric current alternately passes the junctions between the metal and the p-type semiconductor and the junctions between the metal and the n-type semiconductor, and temperature differences take place between the electrically insulating substrates.

The thermoelectric module has found a wide variety of applications such as, for example, an electric refrigerator and a cooling box. One of the reasons why the thermoelectric module is used in refrigerators is that the manufacturers were prohibited from using freon as the refrigerant, because freon has seriously damaged the ozone layer. The thermoelectric module is expected to transfer thermal energy under severe conditions. For example, purchasers generally request the manufacturer of the thermoelectric module to enhance the cooling efficiency and the mechanical strength. However, the prior art thermoelectric module merely achieves a low converting efficiency, and does not satisfy the purchasers' requests. Thus, a problem inherent in the prior art thermoelectric module is the low converting efficiency.

SUMMARY OF THE INVENTION

It is therefore an important object of the present invention to provide a thermoelectric module, which achieves a high converting efficiency.

The present inventors contemplated the problem inherent in the prior art thermoelectric module, and noticed the air filling the space in the array of the semiconductor columns. The present inventors investigated prior art thermoelectric modules to see what factor had serious influences on the current-to-temperature difference characteristics of the thermoelectric module.

The present inventors measured the dimensions of the prior art thermoelectric modules. The prior art thermoelectric modules had the same structure as that described hereinbefore. The present inventors calculated the area of the inner surface and the total contact area between the semiconductor columns and the metal electrodes, and particularly observed the ratio of the total contact area to the area of the inner surface, wherein the ratio represents the amount of air filling the space. The results are tabulated below.

TABLE 1

| Substrate Size (mm) | Inner Surface area of Substrate ($mm^2$) | Contact Area of Semi-conductor columns ($mm^2$) | Number of Semi-conductor Columns | Total Contact Area ($mm^2$) | Ratio |
|---|---|---|---|---|---|
| 8 × 8 | 64 | 0.64 × 0.64 | 62 | 25.40 | 0.397 |
| 40 × 40 | 1600 | 1.6 × 1.6 | 254 | 650.24 | 0.406 |
| 30 × 30 | 900 | 1.1 × 1.1 | 254 | 307.34 | 0.341 |

The present inventors fabricated thermoelectric modules which had a ratio greater than that of the prior art thermoelectric modules. The thermoelectric modules of the present invention achieved a converting efficiency higher than that of the prior art thermoelectric modules. The present inventors therefore concluded that the amount of air filling the space had strong influences on the converting efficiency. Although there was a limit on the density of the metal electrodes in the inner surfaces of the electrically insulating substrates, the limit was varied with the development of the fabrication technologies. The present inventors found a criticality at a ratio of 0.42.

The present invention was made on the basis of the above-described discovery, and proposes to increase the ratio of the total contact area to the area of the inner surface to at least 0.42.

In accordance with one aspect of the present invention, there is provided a thermoelectric module comprising an electrically insulating substrate structure having a major surface and plural thermoelectric junctions arranged on said major surface, connected to one another so as to produce temperature differences on said major surface and including semiconductor elements having cross sections respectively, and the ratio of the total area of said cross sections to an area of said major surface is equal to or greater than 0.42.

BRIEF DESCRIPTION OF THE DRAWINGS

The features and advantages of the thermoelectric module will be more clearly understood from the following description taken in conjunction with the accompanying drawings in which.

DESCRIPTION OF THE PREFERRED EMBODIMENTS

Figure 1:
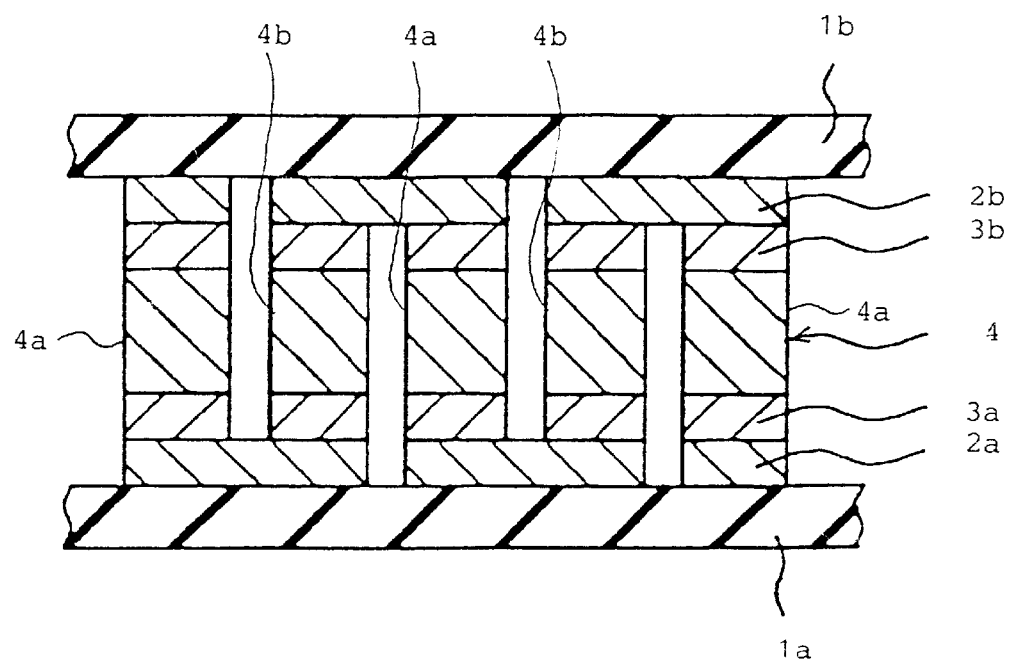
FIG. 1 is a cross sectional view showing the structure of a thermoelectric module according to the present invention.

Referring to FIG. 1 of the drawings, a thermoelectric module embodying the present invention comprises a pair of electrically insulating substrates 1a/1b, plural metal electrodes 2a/2b and plural semiconductor columns 4 fixed to the metal electrodes 2a/2b by means of solder layers 3a/3b.

Figure 2:
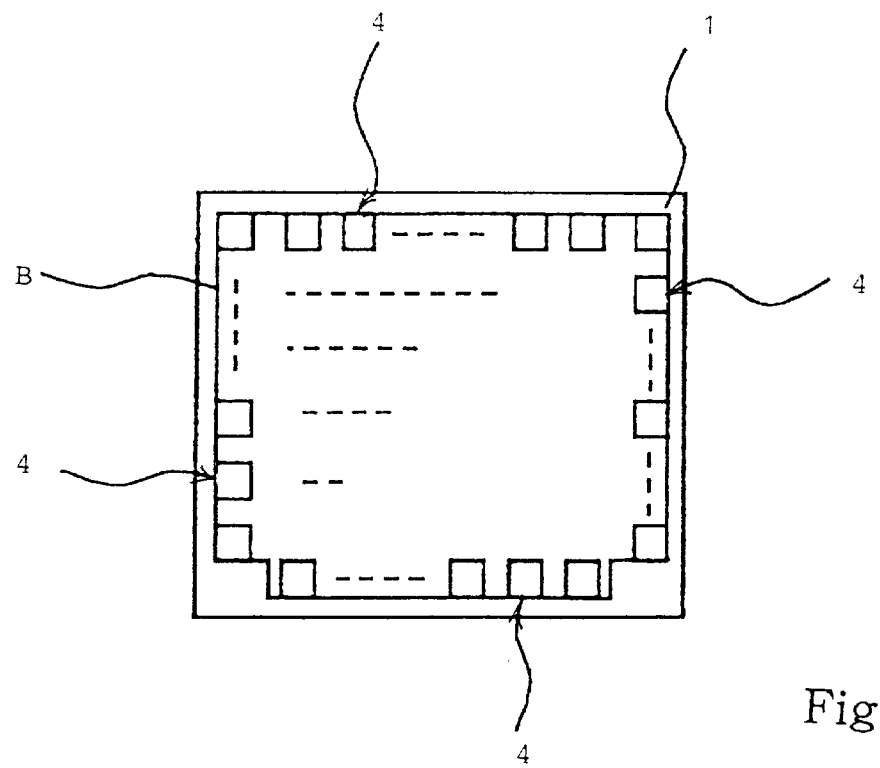
FIG. 2 is a view showing the layout of the semiconductor columns incorporated in the thermoelectric module.

The electrically insulating substrate 1a is spaced from the other electrically insulating substrate 1b, and the metal electrodes 2a and the other metal electrodes 2b are fixed to the inner surface of the electrically insulating substrate 1a at equal spaces and on the inner surface of the other electrically insulating substrate 1b at equal spaces. However, the metal electrodes 2a are not aligned with the other metal electrodes 2b, but are offset therefrom. The right portions of the metal electrodes 2a are opposed to the left portions of the other metal electrodes 2b, respectively, and the semiconductor columns 4 are soldered to the metal electrodes 2a/2b. The semiconductor columns 4a are formed of n-type semiconductor material, and the semiconductor columns 4b are formed of p-type semiconductor material. The n-type semiconductor columns 4a and the p-type semiconductor columns 4b are alternately arranged between the metal electrodes 2a and the metal electrodes 2b, and form a matrix as shown in FIG. 2. The matrix of the semiconductor columns 4 occupies a region B, and the outermost semiconductor columns are located along the periphery of the region B. In this instance, the Peltier junctions are produced between the metal electrodes 2a/2b and the semiconductor columns 4a/4b.

The electrically insulating substrates 1a/1b are, by way of example, formed of $Al_2O_3$. The metal electrodes 2a/2b are, by way of example, formed of copper. The copper is plated on the electrically insulating substrates 1a/1b. Otherwise, copper plates are formed through a DBC (Direct Bonding Copper) technique. At least one of the metal electrodes 2a/2b has the thickness equal to or greater than 50 microns, and the heat conductivity of the semiconductor columns 4 is equal to or less than 1.35 watt/(m·K). "K" stands for degrees Kelvin.

Electric current alternately passes the Peltier junctions between the metal electrodes 2a/2b and the n-type semiconductor columns 4a and the Peltier junction between the metal electrodes 2a/2b and the p-type semiconductor columns 4b. When the electric current flows from the left side to the right side, the electrically insulating substrate 1a serves as a hot side, and the other electrically insulating substrate 1b serves as a cold side.

The semiconductor columns 4 respectively have square cross sections, and the square cross sections total to A. S stands for the area of the inner surface of the electrically isolating substrate 1a/1b, and the area of the region B is represented by P. When the electrically insulating substrates 1a/1b are different in size from each other, the inner surface of the small-sized electrically insulating substrate 1a/1b is measured for the area S. Each of the metal electrodes 2a/2b is held in contact with the inner surface, and D represents the total contact area between the metal electrodes 2a/2b and the inner surfaces of the electrically insulating substrates 1a/1b. In this instance, the ratio of the total area A to the area S, i.e., A/S is equal to or greater than 0.42. The ratio of the total area A to the occupation area P, i.e., A/P is equal to or greater than 0.45. The ratio of the contact area D to the area S is equal to or greater than 0.75. The above-described ranges are reasoned as follows.

Ratio A/S

When the thermoelectric module has the ratio A/S equal to or greater than 0.42, the semiconductor columns 4 are arrayed on the inner surface at high density, and, accordingly, the space in the array of the semiconductor columns is so narrow that convection is suppressed. For this reason, heat loss through convection is reduced, and the converting efficiency of thermoelectric module is improved. The large ratio A/S is desirable from the viewpoint of mechanical strength. The thermoelectric module with the ratio A/S equal to or greater than 0.42 exhibits good impact resistance and good vibration proof capability. The criticality at the ratio of 0.42 will be described hereinafter. When the thermoelectric module has a ratio A/S equal to or greater than 0.5, the conversion efficiency is drastically improved.

Ratio A/P

The ratio of the total area A to the occupation area P is strictly proportional to the amount of air filling the space in the array of the semiconductor columns 4. The larger the ratio A/P, the higher the density of the semiconductor columns 4. When the ratio A/P is equal to or greater than 0.45, the heat loss is reduced. It is preferable to have the ratio A/P equal to or greater than 0.55.

Ratio D/S

The heat is transferred between the metal electrodes 2a/2b and the associated electrically insulating substrates 1a/1b. The Peltier junctions heat and cool the metal electrodes 2a and 2b. The wider the metal electrodes, the higher the efficiency of the heat transfer. When the ratio D/S is equal to or greater than 0.75, the thermoelectric module exhibits good endoergic/exoergic characteristics. It is preferably to increase the ratio D/S to 0.8 or more.

Thickness of the Metal Electrodes

The thicker the metal electrode, the smaller the amount of Joule's heat. When the density of heat flux is large, the metal electrodes are heated, and the electric resistance of the metal electrode is increased. This means that thick metal electrodes 2a/2b are preferable. When the metal electrodes 2a/2b are equal to or greater than 50 microns thick, the electric resistance is suppressed, and the metal electrodes 2a/2b are prevented from the Joule's heat. It is preferable to increase the metal electrodes 2a/2b to 100 microns thick. The metal electrodes 2a/2b of 150 microns thick are more preferable.

Heat Conductivity

In order to keep the performance of the thermoelectric module high, it is preferable to employ a semiconductor material having a small heat conductivity for the semiconductor columns 4. When the semiconductor columns 4 have wide cross sections, the reduction of heat conductivity is important.

When the heat conductivity is equal to or less than 1.35 watt/(m·K), the thermoelectric module exhibits good performance. It is preferable to decrease the heat conductivity to 1.3 watt/(m·K). A heat conductivity of 1.2 watt/(m·K) is even more preferable. Although both n-type and p-type semiconductor columns 4a/4b preferably fall within the above described range, the thermoelectric module exhibits fairly good performance when only one or the other of the n-type or p-type semiconductor falls within the above range.

EXAMPLES

The present inventors fabricated samples of the thermoelectric modules, and the features of the samples were tabulated as follows. In the following tables, "SUB", "S.C. COLUMN", "ELECTRODE" and "H.C." stand for the electrically insulating substrate 1a/1b, the semiconductor columns 4, the metal electrodes 2a/2b and the heat conductivity, respectively. "Periphery" means the distance between the edges of the electrically insulating substrate 1a/1b and the boundary of the region B. "Pairs" mean the number of pairs of n-type/p-type semiconductor columns. "Spaces" mean the distance between the semiconductor columns adjacent to each other.

TABLE 2

|  |  | Sample No. 1 | Sample No. 2 | Sample No. 3 | Sample No. 4 |
|---|---|---|---|---|---|
| SUB. | Size (mm) | 6.92 × 6.92 | 7.13 × 7.13 | 7.48 × 7.48 | 7.76 × 7.76 |
|  | Area "S" (mm$^2$) | 47.89 | 50.84 | 55.95 | 60.22 |
|  | Periphery (mm) | 0.2 | 0.2 | 0.2 | 0.2 |
| S.C. COLUMN | Pairs | 31 | 31 | 31 | 31 |
|  | Cross Sec. (mm) | 0.64 × 0.64 | 0.64 × 0.64 | 0.64 × 0.64 | 0.64 × 0.64 |
|  | Area (mm$^2$) | 0.410 | 0.410 | 0.410 | 0.410 |
|  | Total Area "A" (mm$^2$) | 25.40 | 25.40 | 25.40 | 25.40 |
|  | Spaces (mm) | 0.20 | 0.23 | 0.28 | 0.32 |
|  | Occupation area "P" | 42.51 | 45.29 | 50.13 | 54.17 |
|  | Ratio "A/P" | 0.60 | 0.56 | 0.51 | 0.47 |
| RATIO "A/S" |  | 0.53 | 0.50 | 0.45 | 0.42 |
| ELECTRODE | Size (mm) | 0.64 × 1.48 | 0.64 × 1.51 | 0.64 × 1.56 | 0.64 × 1.60 |
|  | Thickness (mm) | 0.05 | 0.05 | 0.05 | 0.05 |
|  | Area (mm$^2$) | 0.95 | 0.97 | 1.00 | 1.02 |
|  | Total Area "D" on Cold Side (mm$^2$) | 30.31 | 30.92 | 31.95 | 32.77 |
| RATIO "D/S" |  | 0.63 | 0.61 | 0.57 | 0.54 |
| H.C. (watt/(m. K)) |  | 1.5 | 1.5 | 1.5 | 1.5 |

TABLE 3

|  |  | Sample No. 5 | Sample No. 6 | Sample No. 7 | Sample No. 8 |
|---|---|---|---|---|---|
| SUB. | Size (mm) | 7.97 × 7.97 | 8.32 × 8.32 | 8.67 × 8.67 | 8 × 8 |
|  | Area "S" (mm$^2$) | 63.52 | 69.22 | 75.17 | 64 |
|  | Periphery (mm) | 0.2 | 0.2 | 0.2 | 0.2 |
| S.C. COLUMN | Pairs | 31 | 31 | 31 | 31 |
|  | Cross Sec. (mm) | 0.64 × 0.64 | 0.64 × 0.64 | 0.64 × 0.64 | 0.5 × 0.5 |
|  | Area (mm$^2$) | 0.410 | 0.410 | 0.410 | 0.250 |
|  | Total Area "A" (mm$^2$) | 25.40 | 25.40 | 25.40 | 15.50 |
|  | Spaces (mm) | 0.35 | 0.4 | 0.45 | 0.51 |
|  | Occupation area "P" | 57.30 | 62.73 | 68.39 | 57.76 |
|  | Ratio "A/P" | 0.44 | 0.40 | 0.37 | 0.27 |
| RATIO "A/S" |  | 0.40 | 0.37 | 0.34 | 0.24 |
| ELECTRODE | Size (mm) | 0.64 × 1.63 | 0.64 × 1.68 | 0.64 × 1.73 | 0.5 × 1.51 |
|  | Thickness (mm) | 0.05 | 0.05 | 0.05 | 0.04 |
|  | Area (mm$^2$) | 1.04 | 1.08 | 1.11 | 0.76 |
|  | Total Area "D" on Cold Side (mm$^2$) | 33.38 | 34.41 | 35.43 | 24.16 |
| RATIO "D/S" |  | 0.53 | 0.50 | 0.47 | 0.38 |
| H.C. (watt/(m. K)) |  | 1.5 | 1.5 | 1.5 | 1.5 |

TABLE 4

|  |  | Sample No. 9 | Sample No. 10 | Sample No. 11 | Sample No. 12 |
|---|---|---|---|---|---|
| SUB. | Size (mm) | 8 × 8 | 8 × 8 | 8 × 8 | 8 × 8 |
|  | Area "S" (mm$^2$) | 64 | 64 | 64 | 64 |
|  | Periphery (mm) | 0.2 | 0.2 | 0.2 | 0.2 |
| S.C. COLUMN | Pairs | 31 | 31 | 31 | 31 |
|  | Cross Sec. (mm) | 0.55 × 0.55 | 0.6 × 0.6 | 0.64 × 0.64 | 0.67 × 0.67 |
|  | Area (mm$^2$) | 0.303 | 0.360 | 0.410 | 0.449 |
|  | Total Area "A" (mm$^2$) | 18.76 | 22.32 | 25.40 | 27.83 |
|  | Spaces (mm) | 0.46 | 0.40 | 0.35 | 1.32 |
|  | Occupation area "P" | 57.76 | 57.76 | 57.76 | 57.76 |
|  | Ratio "A/P" | 0.32 | 0.39 | 0.44 | 0.48 |
| RATIO "A/S" |  | 0.293 | 0.349 | 0.397 | 0.435 |
| ELECTRODE | Size (mm) | 0.55 × 1.56 | 0.6 × 1.6 | 0.64 × 1.63 | 0.67 × 1.66 |
|  | Thickness (mm) | 0.04 | 0.04 | 0.04 | 0.04 |
|  | Area (mm$^2$) | 0.86 | 0.96 | 1.04 | 1.11 |
|  | Total Area "D" on Cold Side (mm$^2$) | 27.46 | 30.72 | 33.38 | 35.59 |
| RATIO "D/S" |  | 0.43 | 0.48 | 0.52 | 0.56 |
| H.C. (watt/(m. K)) |  | 1.5 | 1.5 | 1.5 | 1.5 |

TABLE 5

|  |  | Sample No. 13 | Sample No. 14 | Sample No. 15 | Sample No. 16 |
|---|---|---|---|---|---|
| SUB. | Size (mm) | 8 × 8 | 8 × 8 | 8 × 8 | 8 × 8 |
|  | Area "S" (mm$^2$) | 64 | 64 | 64 | 64 |
|  | Periphery (mm) | 0.2 | 0.2 | 0.2 | 0.2 |
| S.C. COLUMN | Pairs | 31 | 31 | 31 | 31 |
|  | Cross Sec. (mm) | 0.7 × 0.7 | 0.75 × 0.75 | 0.8 × 0.8 | 0.7 × 0.7 |
|  | Area (mm$^2$) | 0.490 | 0.563 | 0.640 | 0.490 |
|  | Total Area "A" (mm$^2$) | 30.38 | 34.88 | 39.68 | 30.38 |
|  | Spaces (mm) | 0.29 | 0.23 | 0.17 | 0.29 |
|  | Occupation area "P" | 57.76 | 57.76 | 57.76 | 57.76 |
|  | Ratio "A/P" | 0.53 | 0.60 | 0.69 | 0.53 |
| RATIO "A/S" |  | 0.475 | 0.545 | 0.620 | 0.475 |
| ELECTRODE | Size (mm) | 0.7 × 1.69 | 0.75 × 1.73 | 0.8 × 1.77 | 0.8 × 1.8 |
|  | Thickness (mm) | 0.04 | 0.04 | 0.04 | 0.04 |
|  | Area (mm$^2$) | 1.18 | 1.30 | 1.42 | 1.44 |
|  | Total Area "D" on Cold Side (mm$^2$) | 37.86 | 41.52 | 45.31 | 46.08 |
| RATIO "D/S" |  | 0.59 | 0.65 | 0.71 | 0.72 |
| H.C. (watt/(m. K)) |  | 1.5 | 1.5 | 1.5 | 1.5 |

TABLE 6

|  |  | Sample No. 17 | Sample No. 18 | Sample No. 19 | Sample No. 20 |
|---|---|---|---|---|---|
| SUB. | Size (mm) | 8 × 8 | 8 × 8 | 8 × 8 | 8 × 8 |
|  | Area "S" (mm$^2$) | 64 | 64 | 64 | 64 |
|  | Periphery (mm) | 0.2 | 0.2 | 0.2 | 0.2 |
| S.C. COLUMN | Pairs | 31 | 31 | 31 | 31 |
|  | Cross Sec. (mm) | 0.7 × 0.7 | 0.7 × 0.7 | 0.75 × 0.75 | 0.75 × 0.75 |
|  | Area (mm$^2$) | 0.490 | 0.490 | 0.563 | 0.563 |
|  | Total Area "A" (mm$^2$) | 30.38 | 30.38 | 34.88 | 34.88 |
|  | Spaces (mm) | 0.29 | 0.29 | 0.23 | 0.23 |
|  | Occupation area "P" | 57.76 | 57.76 | 57.76 | 57.76 |
|  | Ratio "A/P" | 0.53 | 0.53 | 0.60 | 0.53 |
| RATIO "A/S" |  | 0.475 | 0.475 | 0.545 | 0.545 |
| ELECTRODE | Size (mm) | 0.84 × 1.83 | 0.86 × 1.86 | 0.8 × 1.8 | 0.86 × 1.86 |
|  | Thickness (mm) | 0.04 | 0.04 | 0.04 | 0.04 |
|  | Area (mm$^2$) | 1.54 | 1.60 | 1.44 | 1.60 |
|  | Total Area "D" on Cold Side (mm$^2$) | 49.19 | 51.19 | 46.08 | 51.19 |

TABLE 6-continued

|  |  | Sample No. 17 | Sample No. 18 | Sample No. 19 | Sample No. 20 |
|---|---|---|---|---|---|
| RATIO "D/S" | | 0.77 | 0.80 | 0.72 | 0.80 |
| H.C. (watt/(m. K)) | | 1.5 | 1.5 | 1.5 | 1.5 |

TABLE 7

|  |  | Sample No. 21 | Sample No. 22 | Sample No. 23 | Sample No. 24 |
|---|---|---|---|---|---|
| SUB. | Size (mm) | 8 × 8 | 8 × 8 | 8 × 8 | 8 × 8 |
|  | Area "S" (mm$^2$) | 64 | 64 | 64 | 64 |
|  | Periphery (mm) | 0.2 | 0.2 | 0.2 | 0.2 |
| S.C. COLUMN | Pairs | 31 | 31 | 31 | 31 |
|  | Cross Sec. (mm) | 0.7 × 0.7 | 0.7 × 0.7 | 0.7 × 0.7 | 0.7 × 0.7 |
|  | Area (mm$^2$) | 0.490 | 0.490 | 0.490 | 0.490 |
|  | Total Area "A" (mm$^2$) | 30.38 | 30.38 | 30.38 | 30.38 |
|  | Spaces (mm) | 0.29 | 0.29 | 0.29 | 0.29 |
|  | Occupation area "P" | 57.76 | 57.76 | 57.76 | 57.76 |
|  | Ratio "A/P" | 0.53 | 0.53 | 0.53 | 0.53 |
| RATIO "A/S" | | 0.475 | 0.475 | 0.475 | 0.475 |
| ELEC-TRODE | Size (mm) | 0.8 × 1.83 | 0.8 × 1.8 | 0.8 × 1.8 | 0.8 × 1.8 |
|  | Thickness (mm) | 0.03 | 0.05 | 0.10 | 0.13 |
|  | Area (mm$^2$) | 1.44 | 1.44 | 1.44 | 1.44 |
|  | Total Area "D" on Cold Side (mm$^2$) | 46.08 | 46.08 | 46.08 | 46.08 |
| RATIO "D/S" | | 0.72 | 0.72 | 0.72 | 0.72 |
| H.C. (watt/(m. K)) | | 1.5 | 1.5 | 1.5 | 1.5 |

TABLE 8

|  |  | Sample No. 25 | Sample No. 26 | Sample No. 27 | Sample No. 28 |
|---|---|---|---|---|---|
| SUB. | Size (mm) | 8 × 8 | 8 × 8 | 8 × 8 | 8 × 8 |
|  | Area "S" (mm$^2$) | 64 | 64 | 64 | 64 |
|  | Periphery (mm) | 0.2 | 0.2 | 0.2 | 0.2 |
| S.C. COLUMN | Pairs | 31 | 31 | 31 | 31 |
|  | Cross Sec. (mm) | 0.7 × 0.7 | 0.75 × 0.75 | 0.75 × 0.75 | 0.75 × 0.75 |
|  | Area (mm$^2$) | 0.490 | 0.563 | 0.563 | 0.563 |
|  | Total Area "A" (mm$^2$) | 30.38 | 34.88 | 34.88 | 34.88 |
|  | Spaces (mm) | 0.29 | 0.23 | 0.23 | 0.23 |
|  | Occupation area "P" | 57.76 | 57.76 | 57.76 | 57.76 |
|  | Ratio "A/P" | 0.53 | 0.60 | 0.60 | 0.60 |
| RATIO "A/S" | | 0.475 | 0.545 | 0.545 | 0.545 |
| ELEC-TRODE | Size (mm) | 0.8 × 1.8 | 0.84 × 1.83 | 0.84 × 1.83 | 0.84 × 1.83 |
|  | Thickness (mm) | 0.15 | 0.04 | 0.05 | 0.10 |
|  | Area (mm$^2$) | 1.44 | 1.54 | 1.54 | 1.54 |
|  | Total Area "D" on Cold Side (mm$^2$) | 46.08 | 49.19 | 49.19 | 49.19 |
| RATIO "D/S" | | 0.72 | 0.77 | 0.77 | 0.77 |
| H.C. (watt/(m. K)) | | 1.5 | 1.5 | 1.5 | 1.5 |

TABLE 9

|  |  | Sample No. 29 | Sample No. 30 | Sample No. 31 | Sample No. 32 |
|---|---|---|---|---|---|
| SUB. | Size (mm) | 8 × 8 | 8 × 8 | 8 × 8 | 8 × 8 |
|  | Area "S" (mm$^2$) | 64 | 64 | 64 | 64 |
|  | Periphery (mm) | 0.2 | 0.2 | 0.2 | 0.2 |
| S.C. | Pairs | 31 | 31 | 31 | 31 |

TABLE 9-continued

|  |  | Sample No. 29 | Sample No. 30 | Sample No. 31 | Sample No. 32 |
|---|---|---|---|---|---|
| COLUMN | Cross Sec. (mm) | 0.75 × 0.75 | 0.75 × 0.75 | 0.7 × 0.7 | 0.7 × 0.7 |
|  | Area (mm$^2$) | 0.563 | 0.563 | 0.490 | 0.490 |
|  | Total Area "A" (mm$^2$) | 34.88 | 34.88 | 30.38 | 30.38 |
|  | Spaces (mm) | 0.23 | 0.23 | 0.29 | 0.29 |
|  | Occupation area "P" | 57.76 | 57.76 | 57.76 | 57.76 |
|  | Ratio "A/P" | 0.60 | 0.60 | 0.53 | 0.53 |
| RATIO "A/S" | | 0.545 | 0.545 | 0.475 | 0.475 |
| ELEC-TRODE | Size (mm) | 0.84 × 1.83 | 0.84 × 1.83 | 0.8 × 1.8 | 0.8 × 1.8 |
|  | Thickness (mm) | 0.15 | 0.17 | 0.10 | 0.10 |
|  | Area (mm$^2$) | 1.54 | 1.54 | 1.44 | 1.44 |
|  | Total Area "D" on Cold Side (mm$^2$) | 49.19 | 49.19 | 46.08 | 46.08 |
| RATIO "D/S" | | 0.77 | 0.77 | 0.72 | 0.72 |
| H.C. (watt/(m. K)) | | 1.5 | 1.5 | 1.55 | 1.45 |

TABLE 10

|  |  | Sample No. 33 | Sample No. 34 | Sample No. 35 | Sample No. 36 |
|---|---|---|---|---|---|
| SUB. | Size (mm) | 8 × 8 | 8 × 8 | 8 × 8 | 8 × 8 |
|  | Area "S" (mm$^2$) | 64 | 64 | 64 | 64 |
|  | Periphery (mm) | 0.2 | 0.2 | 0.2 | 0.2 |
| S.C. COLUMN | Pairs | 31 | 31 | 31 | 31 |
|  | Cross Sec. (mm) | 0.7 × 0.7 | 0.7 × 0.7 | 0.7 × 0.7 | 0.75 × 0.75 |
|  | Area (mm$^2$) | 0.490 | 0.490 | 0.490 | 0.563 |
|  | Total Area "A" (mm$^2$) | 30.38 | 30.38 | 30.38 | 34.88 |
|  | Spaces (mm) | 0.29 | 0.29 | 0.29 | 0.23 |
|  | Occupation area "P" | 57.76 | 57.76 | 57.76 | 57.76 |
|  | Ratio "A/P" | 0.53 | 0.53 | 0.53 | 0.60 |
| RATIO "A/S" | | 0.475 | 0.475 | 0.475 | 0.545 |
| ELEC-TRODE | Size (mm) | 0.8 × 1.8 | 0.8 × 1.8 | 0.8 × 1.8 | 0.84 × 1.83 |
|  | Thickness (mm) | 0.10 | 0.10 | 0.10 | 0.15 |
|  | Area (mm$^2$) | 1.44 | 1.44 | 1.44 | 1.54 |
|  | Total Area "D" on Cold Side (mm$^2$) | 46.08 | 46.08 | 46.08 | 49.19 |
| RATIO "D/S" | | 0.72 | 0.72 | 0.72 | 0.77 |
| H.C. (watt/(m. K)) | | 1.4 | 1.35 | 1.3 | 1.55 |

TABLE 11

|  |  | Sample No. 37 | Sample No. 38 | Sample No. 39 | Sample No. 40 |
|---|---|---|---|---|---|
| SUB. | Size (mm) | 8 × 8 | 8 × 8 | 8 × 8 | 8 × 8 |
|  | Area "S" (mm$^2$) | 64 | 64 | 64 | 64 |
|  | Periphery (mm) | 0.2 | 0.2 | 0.2 | 0.2 |
| S.C. COLUMN | Pairs | 31 | 31 | 31 | 31 |
|  | Cross Sec. (mm) | 0.75 × 0.75 | 0.75 × 0.75 | 0.75 × 0.75 | 0.75 × 0.75 |
|  | Area (mm$^2$) | 0.563 | 0.563 | 0.563 | 0.563 |
|  | Total Area "A" (mm$^2$) | 34.88 | 34.88 | 34.88 | 34.88 |
|  | Spaces (mm) | 0.23 | 0.23 | 0.23 | 0.23 |
|  | Occupation area "P" | 57.76 | 57.76 | 57.76 | 57.76 |
|  | Ratio "A/P" | 0.60 | 0.60 | 0.60 | 0.60 |
| RATIO "A/S" | | 0.545 | 0.545 | 0.545 | 0.545 |
| ELEC-TRODE | Size (mm) | 0.84 × 1.83 | 0.84 × 1.83 | 0.84 × 1.83 | 0.84 × 1.83 |
|  | Thickness (mm) | 0.15 | 0.15 | 0.15 | 0.15 |
|  | Area (mm$^2$) | 1.54 | 1.54 | 1.54 | 1.54 |
|  | Total Area "D" on Cold Side (mm$^2$) | 49.19 | 49.19 | 49.19 | 49.19 |

TABLE 11-continued

|  | Sample No. 37 | Sample No. 38 | Sample No. 39 | Sample No. 40 |
|---|---|---|---|---|
| RATIO "D/S" | 0.77 | 0.77 | 0.77 | 0.77 |
| H.C. (watt/(m. K)) | 1.45 | 1.4 | 1.35 | 1.3 |

TABLE 12

| | | Sample No. 41 | Sample No. 42 | Sample No. 43 | Sample No. 44 |
|---|---|---|---|---|---|
| SUB. | Size (mm) | 6.92 × 6.92 | 7.13 × 7.13 | 7.48 × 7.48 | 7.76 × 7.76 |
| | Area "S" (mm²) | 47.89 | 50.84 | 55.95 | 60.22 |
| | Periphery (mm) | 0.2 | 0.2 | 0.2 | 0.2 |
| S.C. | Pairs | 31 | 31 | 31 | 31 |
| COL-UMN | Area (mm²) | 0.410 | 0.410 | 0.410 | 0.410 |
| | Total Area "A" (mm²) | 25.40 | 25.40 | 25.40 | 25.40 |
| | Occupation Area "P" (mm²) | 42.51 | 45.29 | 50.13 | 54.17 |
| | Spaces (mm) | 0.20 | 0.23 | 0.28 | 0.32 |
| RATIO "A/P" | | 0.60 | 0.56 | 0.51 | 0.47 |
| RATIO "A/S" | | 0.53 | 0.50 | 0.45 | 0.42 |
| ELEC-TRODE | Size (mm) | 0.64 × 1.48 | 0.64 × 1.51 | 0.64 × 1.56 | 0.64 × 1.60 |
| | Thickness (mm) | 0.05 | 0.05 | 0.05 | 0.05 |
| | Area (mm²) | 0.95 | 0.97 | 1.00 | 1.02 |
| | Total Area "D" On Cold Side (mm²) | 30.31 | 30.92 | 31.95 | 32.77 |
| RATIO "D/S" | | 0.63 | 0.61 | 0.57 | 0.54 |

TABLE 13

| | | Sample No. 45 | Sample No. 46 | Sample No. 47 |
|---|---|---|---|---|
| SUB. | Size (mm) | 7.97 × 7.97 | 8.32 × 8.32 | 8.67 × 8.67 |
| | Area "S" (mm²) | 63.52 | 69.22 | 75.17 |
| | Periphery (mm) | 0.2 | 0.2 | 0.2 |
| S.C. | Pairs | 31 | 31 | 31 |
| COL-UMN | Area (mm²) | 0.410 | 0.410 | 0.410 |
| | Total Area "A" (mm²) | 25.40 | 25.40 | 25.40 |
| | Occupation Area "P" (mm²) | 57.30 | 62.73 | 68.39 |
| | Spaces (mm) | 0.35 | 0.4 | 0.45 |
| RATIO "A/P" | | 0.44 | 0.40 | 0.37 |
| RATIO "A/S" | | 0.40 | 0.37 | 0.34 |
| ELEC-TRODE | Size (mm) | 0.64 × 1.63 | 0.64 × 1.68 | 0.64 × 1.73 |
| | Thickness (mm) | 0.05 | 0.05 | 0.05 |
| | Area (mm²) | 1.04 | 1.08 | 1.11 |
| | Total Area "D" on Cold Side(mm²) | 33.38 | 34.41 | 35.43 |
| RATIO "D/S" | | 0.53 | 0.50 | 0.47 |

Analysis on First Group

Samples 1 to 7 were fabricated on the electrically insulating substrates 1a/1b, which were formed of $Al_2O_3$. The n-type/p-type semiconductor columns were 0.8 millimeter in height, and the electrically insulating substrates 1a/1b were 0.3 millimeter thick. The heat conductivity of the semiconductor columns 4 was 1.5 watt/(m·K) as shown.

The present inventors investigated the converting efficiency and the mechanical strength as follows. The cold side Tc and the hot side Th were maintained at 25 degrees and 60 degrees in centigrade. The converting efficiency η was calculated as $$\eta = Q/Wp \qquad \text{Equation 1}$$

where Q was the quantity of endothermic energy and Wp was electric power consumption of the thermoelectric module. The quantity of endothermic energy Q was assumed to be 1 third of the maximum quantity of endothermic energy at Tc=Th=42.5 degrees in centigrade.

Figure 3:
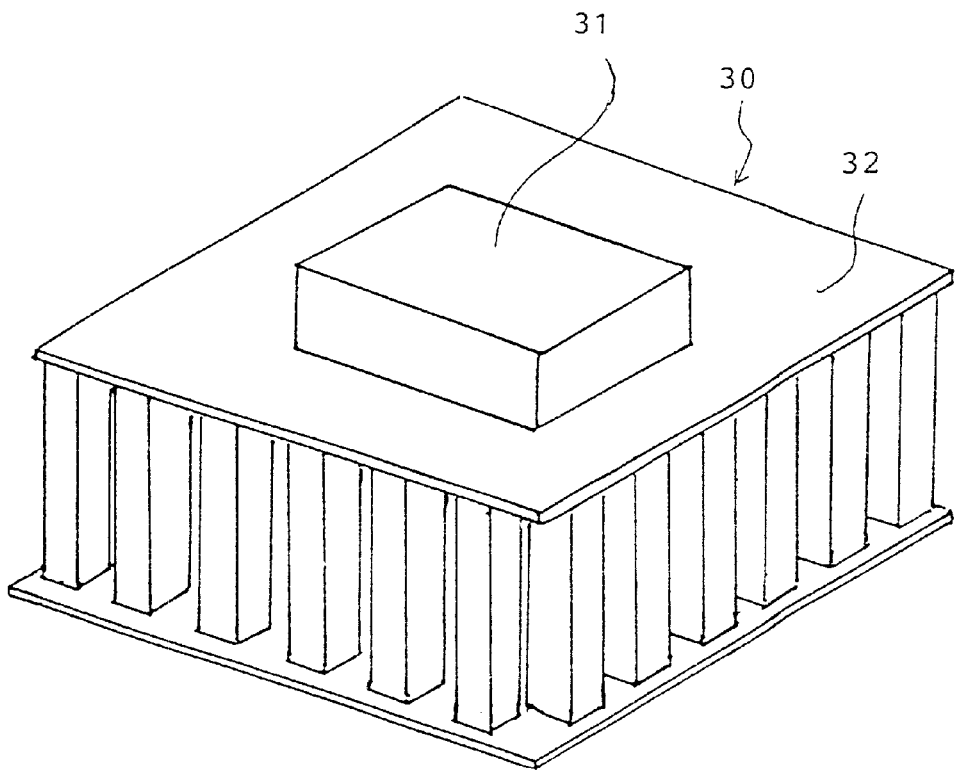
FIG. 3 is a perspective view showing a thermoelectric module subjected to mechanical tests.
Figure 3:
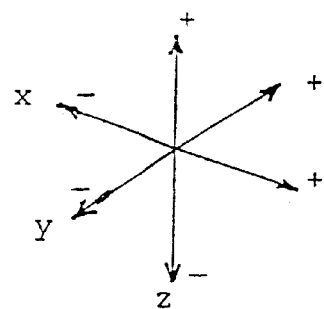

The mechanical strength was evaluated from the viewpoint of the impact resistance and the vibration proof capability. The present inventors experimented on the impact resistance as follows. The present inventors fabricated at least one thermoelectric module 30 for each of samples 1 to 7 (see FIG. 3). First, the present inventors measured the serial resistance ACR1 of the thermoelectric modules 30 against the alternating current of 0.1 milliampere at 1 kHz. Weight 31 of 1.2 grams was soldered to the electrically insulating substrate 32 on the cold side. Subsequently, the present inventors repeatedly exerted an acceleration of 1500 G on each of the thermoelectric modules 30. The acceleration was exerted in a direction parallel to the x-axis (see FIG. 3) for 0.5 milliseconds five times, in the opposite direction for 0.5 milliseconds five times, in a direction parallel to the y-axis for 0.5 milliseconds five times, in the opposite direction for 0.5 milliseconds five times, in a direction parallel to the z-axis for 0.5 milliseconds five times, in the opposite direction for 0.5 milliseconds five times in accordance with MIL Standards, STD-883, 2002, Condition B 1500 G-0.5 ms.

Thereafter, the present inventors measured the serial resistance ACR2 against the alternating current of 0.1 milliampere at 1 kHz, again, and calculated the rate of change Δ ACR, i.e., the difference between ACR1 and ACR2. The present inventors evaluated the samples on the basis of the rate of change Δ ACR and the rate of change Δ Δ Tmax. The rate of change Δ Δ Tmax is described hereinlater in detail.

The present inventors experimented on the vibration proof capability as follows. The present inventors measured the maximum temperature difference ΔT1max at 27 degrees centigrade. Subsequently, the present inventors exerted an acceleration of 20 G in a direction parallel to the x-axis from 20 Hz to 2000 Hz four times, in a direction parallel to the y-axis from 20 Hz to 2000 Hz four times and in a direction parallel to the z-axis from 20 Hz to 2000 Hz four times in accordance with the MIL Standards, STD 883, 2007, Condition A 20 G, 20–2000 Hz. The present inventors measured the maximum temperature difference ΔT2max at 27 degrees centigrade, and calculated the rate of change ΔΔTmax, i.e., the difference between ΔT1max and ΔT2max. The present inventors evaluated the vibration proof capability on the basis of the rate of change ΔΔTmax and the rate of change ΔACR. The results were tabulated as follows. In Tables 14 to 22, the term "embodiment" and the term "comparative example" are abbreviated as "EM" and "CM", respectively. Abbreviations "Av" and Dt" stand for the term "average" and the term "data", respectively.

TABLE 14

| No. | Sample No. | η Av Dt | Impact Resistance | | Vibration Proof Capability | |
|---|---|---|---|---|---|---|
| | | | ΔACR % Av Dt | ΔΔTmax % Av Dt | ΔACR % Av Dt | ΔΔTmax % Av Dt |
| EM 1 | 1 | 0.6 | ≦±0.5 | ≦±3 | ≦±0.5 | ≦±3 |
| | | 0.6 | 0.5 | 3 | 0.5 | 3 |
| | | 0.59 | −0.5 | −3.3 | −0.5 | −3.3 |
| | | 0.62 | 0.48 | 2.9 | 0.48 | 2.9 |
| | | 0.6 | 0.5 | 2.1 | 0.5 | 2.6 |
| | | 0.58 | −0.5 | 2.7 | −0.5 | 2.7 |
| | | 0.61 | 0.46 | | 0.47 | |
| EM 2 | 2 | 0.6 | ≦±0.5 | ≦±3 | ≦±0.5 | ≦±3 |
| | | 0.6 | 0.5 | 2.6 | 0.5 | 3 |
| | | 0.58 | −0.5 | 3 | −0.5 | −3.3 |
| | | 0.60 | 0.48 | −3 | 0.48 | 2.9 |
| | | 0.6 | 0.5 | 3 | 0.5 | 2.6 |
| | | 0.60 | −0.5 | −3 | −0.5 | 2.7 |
| | | 0.62 | 0.47 | 2.7 | 0.46 | |
| EM 3 | 3 | 0.55 | ≦±1 | ≦±4 | ≦±1 | ≦±3 |
| | | 0.55 | 1 | 3.8 | 1 | 4 |
| | | 0.57 | −1 | 4 | −1 | −4.4 |
| | | 0.52 | 0.98 | −4 | 0.98 | 3.9 |
| | | 0.56 | 0.87 | −3.2 | 0.87 | 3.6 |
| | | 0.55 | −0.5 | 4 | −0.5 | 3.7 |
| | | 0.55 | 1 | 3.8 | 1 | |
| EM 4 | 4 | 0.50 | ≦±2 | ≦±5 | ≦±2 | ≦±5 |
| | | 0.5 | 2 | 4.6 | 2 | 5 |
| | | 0.49 | −2 | 5 | −2 | −4.3 |
| | | 0.51 | 1.8 | −5 | 1.8 | 4.9 |
| | | 0.5 | 2 | 5 | 2 | −5.5 |
| | | 0.49 | −1.7 | −4.8 | −1.7 | |
| | | 0.51 | 1.2 | 4.7 | 1.9 | |
| CM 1 | 5 | 0.45 | ±3≦ | ±8≦ | ±3≦ | ±8≦ |
| | | 0.45 | 3 | 8.8 | 3 | −8 |
| | | 0.44 | −3.4 | 7.2 | −3 | 8.2 |
| | | 0.46 | 3.6 | −8 | 3.8 | 8 |
| | | 0.46 | 3.1 | 8 | 3 | 8.8 |
| | | 0.45 | −3.3 | −8.8 | −3 | 8 |
| | | 0.44 | 8 | 3.9 | 8.2 | |
| CM 2 | 6 | 0.44 | ±3≦ | ±8≦ | ±3≦ | ±8≦ |
| | | 0.45 | 3 | 8.6 | 3 | −8.8 |
| | | 0.44 | −3 | 8 | −3 | 8.8 |
| | | 0.43 | 3.8 | −8 | 3.8 | 8.8 |
| | | 0.44 | 3 | 8 | 3 | 8 |
| | | 0.44 | −3.7 | −8.2 | −3.7 | 8.2 |
| | | 0.44 | 3.9 | 8.7 | 3.9 | |
| CM 3 | 7 | 0.44 | ±3≦ | ±8≦ | ±3≦ | ±8≦ |
| | | 0.44 | −3.2 | 8.6 | 3 | −87 |
| | | 0.44 | −3 | 8 | −3 | 8.8 |
| | | 0.43 | 3 | −8 | 3.8 | 8.8 |
| | | 0.44 | −3.7 | 8 | 3 | 8 |
| | | 0.45 | 3 | −8.2 | −3.7 | 8.2 |
| | | 0.44 | | 8.7 | 3.9 | |

Samples 1 to 4 had a ratio A/S equal to or greater than 0.42, and were within the scope of the present invention. Samples 1 to 4 of the first group were referred to as "embodiments 1 to 4." On the other hand, samples 5 to 7 had a ratio A/S less than 0.42, and were outside the scope of the present invention. Samples 5 to 7 of the first group were referred to as "comparative examples 1 to 3." Comparing the converting efficiency of embodiments 1 to 4 with the converting efficiency of comparative examples 1 to 3, it was determined that the converting efficiency was drastically enhanced in embodiments 1 to 4. The ratio A/S was increased from embodiment 4 to embodiment 3 by 0.03, and the converting efficiency was increased by 0.05. The ratio A/S was increased from comparative example 2 to comparative example 1 by 0.03, and the converting efficiency was increased by 0.01. On the other hand, the ratio A/S was increased from the comparative example 1 to embodiment 4 by 0.02, and the converting efficiency was increased by 0.05.

The increment of the converting efficiency per unit ratio was maximized at embodiment 4, and the embodiment 4 had a ratio A/S of 0.42. Thus, the ratio A/S of 0.42 was found to be the critical point for the present invention. Moreover, embodiments 1 to 4 exhibited good mechanical properties as shown.

Analysis on Second Group

Samples 12 to 15 and 8 to 11 were fabricated on the electrically insulating substrates 1a/1b, which were formed of $Al_2O_3$. The n-type/p-type semiconductor columns were 0.8 millimeter in height, and the electrically insulating substrates 1a/1b were 0.3 millimeter thick. The heat conductivity of the semiconductor columns 4 was 1.5 watt/(m·K) as shown.

The present inventors evaluated samples 12 to 15 and 8 to 11 in a manner similarly performed with samples 1 to 7. The converting efficiency was calculated using equation 1, and the mechanical properties, i.e., the impact resistance and the vibration proof capability were examined for samples 12 to 15 and 8 to 11 in a similar manner as performed for samples 1 to 7. The results are tabulated hereinbelow.

TABLE 15

| No. | Sample No. | η | Impact Resistance | | Vibration Proof Capability | |
|---|---|---|---|---|---|---|
| | | | ΔACR % | ΔΔTmax % | ΔACR % | ΔΔTmax % |
| EM 5 | 12 | 0.5 | ≦±2 | ≦±5 | ≦±2 | ≦±5 |
| EM 6 | 13 | 0.55 | ≦±1 | ≦±4 | ≦±1 | ≦±4 |
| EM 7 | 14 | 0.6 | ≦±0.5 | ≦±3 | ≦±0.5 | ≦±3 |
| EM 8 | 15 | 0.6 | ≦±0.5 | ≦±3 | ≦±0.5 | ≦±3 |
| CM 4 | 8 | 0.42 | ±3≦ | ±8≦ | ±3≦ | ±8≦ |
| CM 5 | 9 | 0.42 | ±3≦ | ±8≦ | ±3≦ | ±8≦ |
| CM 6 | 10 | 0.43 | ±3≦ | ±8≦ | ±3≦ | ±8≦ |
| CM 7 | 11 | 0.45 | ±3≦ | ±8≦ | ±3≦ | ±8≦ |

Samples 12 to 15 had the ratio A/S ranging from 0.435 to 0.620, and were within the scope of the present invention. On the other hand, samples 8 to 11 had the ratio A/S ranging between 0.24 and 0.397, and were out of the scope of the present invention. Samples 12 to 15 of the second group and the samples 8 to 11 of the second group were referred to as "embodiments 5 to 8" and "comparative examples 4 to 7", respectively. Comparing the converting efficiency of the embodiments 5 to 8 with the converting efficiency of the comparative examples 4 to 7, it was understood that the converting efficiency was drastically enhanced in embodiments 5 to 8. Especially embodiments 7 and 8 achieved the converting efficiency of 0.6. Embodiments 7 and 8 had the ratio greater than 0.5. Thus, the ratio A/S equal to or greater than 0.5 was more desirable. Embodiments 5 to 8 exhibited good mechanical properties.

Analysis on Third Group

Samples 17, 18 and 16 were fabricated on the electrically insulating substrates 1a/1b, which were formed of $Al_2O_3$. The n-type/p-type semiconductor columns were 0.8 millimeter in height, and the electrically insulating substrates 1a/1b were 0.3 millimeter thick. The heat conductivity of the semiconductor columns 4 was 1.5 watt/(m·K) as shown. The total area D was the difference between samples 17/18 and sample 13.

The present inventors evaluated samples 17, 18 and 16 in a manner similarly performed with samples 1 to 7. The converting efficiency was calculated using equation 1, and the mechanical properties were examined for samples 17, 18, and 16 in a similar manner to that performed for samples 1 to 7. The results are tabulated hereinbelow.

TABLE 16

| Sam- | | | Impact Resistance | | Vibration Proof Capability | |
|---|---|---|---|---|---|---|
| No. | ple No. | η | ΔACR % | ΔΔTmax % | ΔACR % | ΔΔTmax % |
| EM 9 | 17 | 0.64 | ≦±1 | ≦±4 | ≦±1 | ≦±4 |
| EM 10 | 18 | 0.67 | ≦±1 | ≦±4 | ≦±1 | ≦±4 |
| EM 11 | 16 | 0.59 | ≦±1 | ≦±4 | ≦±1 | ≦±4 |

All the samples had a ratio A/S greater than 0.42, and were within the scope of the present invention. Samples 17, 18 and 16 of the third group were referred to as "embodiments 9–11". Although embodiment 11 had an array of the semiconductor columns identical in dimensions to that of embodiments 9 and 10, the ratio D/S was less than 0.75 (see tables 5 and 60). Comparing the converting efficiency of embodiment 11 with that of embodiments 9 and 10, it was understood that the ratio of D/S influenced the converting efficiency. A ratio D/S equal to or greater than 0.75 was found to be more desirable from the viewpoint of converting efficiency.

Analysis on Fourth Group

Samples 14, 19 and 20 were fabricated on the electrically insulating substrate $1a/1b$. Although sample 14 was equal in total area A to samples 19/20, the total area D was different from one another. The electrically insulating substrates $1a/1b$ were formed of $Al_2O_3$. The n-type/p-type semiconductor columns were 0.8 millimeters in height, and the electrically insulating substrates $1a/1b$ were 0.3 millimeters thick. The heat conductivity of the semiconductor columns 4 was 1.5 watt/(m·K) as shown.

The present inventors evaluated samples 14, 19 and 20 in a manner similarly performed for samples 1 to 7. The converting efficiency was calculated using equation 1, and the mechanical properties were examined for samples 14, 19 and 20 in a similar manner as performed for samples 1 to 7. The results were tabulated hereinbelow.

TABLE 17

| Sam- | | | Impact Resistance | | Vibration Proof Capability | |
|---|---|---|---|---|---|---|
| No. | ple No. | η | ΔACR % | ΔΔTmax % | ΔACR % | ΔΔTmax % |
| EM 12 | 20 | 0.64 | ≦±1 | ≦±4 | ≦±1 | ≦±4 |
| EM 13 | 14 | 0.6 | ≦±0.5 | ≦±3 | ≦±0.5 | ≦±3 |
| EM 14 | 19 | 0.6 | ≦±1 | ≦±4 | ≦±1 | ≦±4 |

Samples 14, 19 and 20 had a ratio A/S greater than 0.42 and were within the scope of the present invention. Samples 20, 14 and 19 of the fourth group were referred to as "embodiments 12–14". Embodiments 12–14 achieved a good converting efficiency, and exhibited good mechanical properties. Comparing the ratio D/S of embodiment 12 with the ratio D/S of embodiments 13/14, embodiment 12 fell within the recommendable range greater than 0.75. However, embodiments 13/14 did not satisfy the minimum value of the ratio D/S. For this reason, embodiment 12 was greater in converting efficiency than embodiments 13/14.

Analysis on Fifth Group

Samples 22 to 25, 21 and 16 were fabricated on the electrically insulating substrates $1a/1b$, which were formed of $Al_2O_3$. The n-type/p-type semiconductor columns were 0.8 millimeters in height, and the electrically insulating substrates $1a/1b$ were 0.3 millimeters thick. The heat conductivity of the semiconductor columns 4 was 1.5 watt/(m·K) as shown. Although samples 22 to 25, 21 and 16 were equal in total area to one another, the metal electrodes $2a/2b$ were different in thickness from one sample to the next.

The present inventors evaluated samples 22 to 25, 21 and 16 in a manner similarly with samples 1 to 7. The converting efficiency was calculated using equation 1, and the mechanical properties were examined in a similar manner that performed for samples 1 to 7. The results are tabulated hereinbelow.

TABLE 18

| Sam- | | | Impact Resistance | | Vibration Proof Capability | |
|---|---|---|---|---|---|---|
| No. | ple No. | η | ΔACR % | ΔΔTmax % | ΔACR % | ΔΔTmax % |
| EM 15 | 22 | 0.63 | ≦±1 | ≦±4 | ≦±1 | ≦±4 |
| EM 16 | 23 | 0.65 | ≦±1 | ≦±4 | ≦±1 | ≦±4 |
| EM 17 | 24 | 0.65 | ≦±1 | ≦±4 | ≦±1 | ≦±4 |
| EM 18 | 25 | 0.65 | ≦±1 | ≦±4 | ≦±1 | ≦±4 |
| EM 19 | 21 | 0.59 | ≦±1 | ≦±4 | ≦±1 | ≦±4 |
| EM 20 | 16 | 0.59 | ≦±1 | ≦±4 | ≦±1 | ≦±4 |

Samples 22 to 25, 21 and 16 had the ratio A/S greater than 0.42, and were within the scope of the present invention. Samples 22 to 25, 21 and 16 of the fifth group were referred to as "embodiments 15 to 20". All the embodiments 15 to 20 achieved high converting efficiency, and exhibited good mechanical properties. Although embodiments 15 to 18 were thicker than 50 microns, embodiments 19 and 20 had thickness less than 50 microns. For this reason, the converting efficiency of embodiments 15 to 18 was greater than the converting efficiency of the other embodiments 19 and 20.

Analysis on Sixth Group

Samples 27 to 30 and 26 were fabricated on the electrically insulating substrates $1a/1b$, which were formed of Al1203. The n-type/p-type semiconductor columns were 0.8 millimeters in height, and the electrically insulating substrates $1a/1b$ were 0.3 millimeters thick. The heat conductivity of the semiconductor columns 4 was 1.5 watt/(m·K) as shown. Although samples 26 to 30 were equal in total area A, the metal electrodes $2a/2b$ were different in thickness from one sample to the next.

The present inventors evaluated samples 27 to 30 and 26 in a manner similar to that performed with samples 1 to 7.

The converting efficiency was calculated using equation 1, and the mechanical properties were examined in a similar manner to that performed for samples 1 to 7. The results are tabulated hereinbelow.

TABLE 19

| No. | Sample No. | η | Impact Resistance ΔACR % | ΔΔTmax % | Vibration Proof Capability ΔACR % | ΔΔTmax % |
|---|---|---|---|---|---|---|
| EM 21 | 27 | 0.77 | ≦±1 | ≦±4 | ≦±1 | ≦±4 |
| EM 22 | 28 | 0.79 | ≦±1 | ≦±4 | ≦±1 | ≦±4 |
| EM 23 | 29 | 0.79 | ≦±1 | ≦±4 | ≦±1 | ≦±4 |
| EM 24 | 30 | 0.8 | ≦±1 | ≦±4 | ≦±1 | ≦±4 |
| EM 25 | 26 | 0.73 | ≦±0.5 | ≦±3 | ≦±0.5 | ≦±3 |

Samples 27 to 30 and 26 had a ratio A/S greater than 0.42, and were within the scope of the present invention. Samples 27 to 30 and 26 of the sixth group were referred to as "embodiments 21 to 25". All the embodiments 21 to 25 achieved a converting efficiency, and exhibited good mechanical properties. Although the metal electrodes 2a/2b of embodiments 21 to 24 were thicker than 50 microns, embodiment 25 had metal electrodes 2a/2b having a thickness less than 50 microns. For this reason, the converting efficiency of embodiments 21 to 24 was greater than the converting efficiency of the other embodiment 25. Converting efficiency was increased together with the thickness of the metal electrodes 2a/2b. Thus, the metal electrodes 2a/2b having thicknesses equal to or greater than 100 microns were more preferable, and metal electrodes 2a/2b having thicknesses equal to or greater than 150 microns were much more preferable.

Analysis on Seventh Group

Samples 34,35,23 and 31 to 33 were fabricated on the electrically insulating substrates 1a/1b formed of Al2O3. The n-type/p-type semiconductor columns were 0.8 millimeters in height, and the electrically insulating substrates 1a/1b were 0.3 millimeters thick. Although samples 23 and 31 to 35 were equal in total area A, the semiconductor columns 4 were different in thermal conductivity from one another.

The present inventors evaluated samples 34, 35 and 23, and 31 to 33 in a manner similar to that performed with samples 1 to 7. The converting efficiency was calculated using equation 1, and the mechanical properties were examined in a similar manner to that performed for samples 1 to 7. The results are tabulated hereinbelow.

TABLE 20

| No. | Sample No. | η | Impact Resistance ΔACR % | ΔΔTmax % | Vibration Proof Capability ΔACR % | ΔΔTmax % |
|---|---|---|---|---|---|---|
| EM 26 | 34 | 0.69 | ≦±1 | ≦±4 | ≦±1 | ≦±4 |
| EM 27 | 35 | 0.7 | ≦±1 | ≦±4 | ≦±1 | ≦±4 |
| EM 28 | 31 | 0.65 | ≦±1 | ≦±4 | ≦±1 | ≦±4 |

TABLE 20-continued

| No. | Sample No. | η | Impact Resistance ΔACR % | ΔΔTmax % | Vibration Proof Capability ΔACR % | ΔΔTmax % |
|---|---|---|---|---|---|---|
| EM 29 | 23 | 0.65 | ≦±1 | ≦±4 | ≦±1 | ≦±4 |
| EM 30 | 32 | 0.66 | ≦±1 | ≦±4 | ≦±1 | ≦±4 |
| EM 31 | 33 | 0.66 | ≦±1 | ≦±4 | ≦±1 | ≦±4 |

Samples 23 and 31 to 35 had the ratio A/S greater than 0.42, and were within the scope of the present invention. Samples of the seventh group were referred to as "embodiments 26 to 31". All the embodiments 26 to 31 achieved high converting efficiency, and exhibited good mechanical properties.

Although the semiconductor columns 4 of embodiments 26 and 27 were equal in thermal conductivity to or less than 1.35 watt/(m·K), embodiments 28 to 31 had the semiconductor columns 4 greater in thermal conductivity than 1.35 watt/(m·K). The converting efficiency of embodiments 26 and 27 was larger than the converting efficiency of the other embodiments 28 to 31. Thus, the thermal conductivity of the semiconductor columns 4 influenced the converting efficiency.

Analysis on Eighth Group

Samples 39, 40 and 30/36 to 38 were fabricated on the electrically insulating substrates 1a/1b of $Al_2O_3$. The n-type/p-type semiconductor columns were 0.7 millimeter in height, and the electrically insulating substrates 1a/1b were 0.3 millimeter thick. Although samples 30 and 36 to 40 were equal in total area A, the semiconductor columns 4 were different in thermal conductivity from one another.

The present inventors evaluated samples 30 and 36 to 40 in a manner similar to that performed with samples 1 to 7. The converting efficiency was calculated using equation 1, and the mechanical properties were examined in a similar manner to that performed for samples 1 to 7. The results are tabulated hereinbelow.

TABLE 21

| No. | Sample No. | η | Impact Resistance Δ ACR % | Δ Δ Tmax % | Vibration Proof Capability Δ ACR % | Δ Δ Tmax % |
|---|---|---|---|---|---|---|
| EM 32 | 39 | 0.86 | ≦±1 | ≦±4 | ≦±1 | ≦±4 |
| EM 33 | 40 | 0.86 | ≦±1 | ≦±4 | ≦±1 | ≦±4 |
| EM 34 | 36 | 0.81 | ≦±0.5 | ≦±3 | ≦±0.5 | ≦±3 |
| EM 35 | 30 | 0.81 | ≦±1 | ≦±4 | ≦±1 | ≦±4 |
| EM 36 | 37 | 0.82 | ≦±1 | ≦±4 | ≦±1 | ≦±4 |
| EM 37 | 38 | 0.82 | ≦±1 | ≦±4 | ≦±1 | ≦±4 |

Samples 30 and 36 to 40 had the ratio A/S greater than 0.42, and were within the scope of the present invention. Samples 39, 40, 36, 30, 37 and 38 were referred to as "embodiments 32 to 37". All the embodiments 32 to 37 achieved high converting efficiency, and exhibited good mechanical properties. Especially, embodiments 32 and 33 achieved extremely large converting efficiency. The extremely large converting efficiency was derived from the small thermal conductivity of the semiconductor columns 4. Although embodiment 27 had the semiconductor columns 4 equal in thermal conductivity to those of embodiment 33, the embodiment 33 achieved the converting efficiency larger than that of embodiment 27. Embodiment 33 was larger in both ratios A/S and D/S than embodiment 27. The ratio D/S was increased at 7 percent, and the ratio A/S was increased at 15 percent. The converting efficiency was increased at 23 percent. Thus, the ratios A/S and D/S had great influence on the converting efficiency regardless of the thermal conductivity of the semiconductor columns 4.

Analysis on Ninth Group

Samples 41 to 47 were fabricated on the electrically insulating substrates 1$a$/1$b$ of $Al_2O_3$. The n-type/p-type semiconductor columns were 0.8 millimeter in height, and the electrically insulating substrates 1$a$/1$b$ were 0.3 millimeter thick. The heat conductivity of the semiconductor columns 4 was 1.5 watt/(m·K). Although samples 41 to 47 were equal in total area A, the occupation area P was different.

The present inventors evaluated samples 41 to 47 in a manner similar to that performed with samples 1 to 7. The converting efficiency was calculated using equation 1, and the mechanical properties were examined in a similar manner to that performed for samples 1 to 7. The results are tabulated hereinbelow.

TABLE 22

| No. | Sample No. | η | Impact Resistance | | Vibration Proof Capability | |
|---|---|---|---|---|---|---|
| | | | Δ ACR % | Δ Δ Tmax % | Δ ACR % | Δ Δ Tmax % |
| EM 38 | 41 | 0.6 | ≤±0.5 | ≤±3 | ≤±0.5 | ≤±3 |
| EM 39 | 42 | 0.6 | ≤±0.5 | ≤±3 | ≤±0.5 | ≤±3 |
| EM 40 | 43 | 0.55 | ≤±1 | ≤±4 | ≤±1 | ≤±4 |
| EM 41 | 44 | 0.5 | ≤±2 | ≤±5 | ≤±2 | ≤±5 |
| CM 8 | 45 | 0.45 | ±3 ≤ | ±8 ≤ | ±3 ≤ | ±8 ≤ |
| CM 9 | 46 | 0.44 | ±3 ≤ | ±8 ≤ | ±3 ≤ | ±8 ≤ |
| CM 10 | 47 | 0.44 | ±3 ≤ | ±8 ≤ | ±3 ≤ | ±8 ≤ |

Samples 41 to 44 had a ratio A/S greater than 0.42 and a ratio A/P greater than 0.45. Samples 45 and 47 had a ratio A/S less than 0.42 and a ratio A/P less than 0.45. Samples 41 to 44 achieved a good converting efficiency, and exhibited good mechanical properties. In particular, embodiments 41 and 42 had a ratio A/P greater than 0.55. Embodiments 41 and 42 each achieved an extremely good converting efficiency and extremely good mechanical properties by virtue of the large A/P ratio.

Although particular embodiments of the present invention have been shown and described, it will be apparent to those skilled in the art that various changes and modifications may be made without departing from the spirit and scope of the present invention.

What is claimed is:

1. A thermoelectric module comprising:
   an electrically insulating substrate structure having a major surface, and
   plural thermoelectric junctions arranged on said major surface, connected to one another so as to produce temperature differences on said major surface when an electrical current flows through said junctions, and including semiconductor elements having cross sections respectively, wherein the ratio of the total area of said cross sections to an area of said major surface is equal to or greater than 0.42.

2. The thermoelectric module as set forth in claim 1, in which said electrically insulating substrate structure includes a first electrically insulating substrate and a second electrically insulating substrate spaced from said first electrically insulating substrate in such a manner that a first inner surface of said first electrically insulating substrate is opposed to a second inner surface of said second electrically insulating substrate, and one of said first and second inner surfaces serves as said area of said major surface.

3. The thermoelectric module as set forth in claim 2, in which said plural thermoelectric junctions further include
   first metal electrodes formed on said first inner surface in a spaced apart configuration and selectively held in contact with first end surfaces of said semiconductor elements, and
   second metal electrodes formed on said second inner surface in a spaced apart configuration and selectively held in contact with second end surfaces of said semiconductor elements.

4. The thermoelectric module as set forth in claim 3, in which p-type semiconductor elements and n-type semiconductor elements serve as said semiconductor elements, and each of the first and second metal electrodes is held in contact with one of said p-type semiconductor elements and an associated one of said n-type semiconductor elements.

5. The thermoelectric module as set forth in claim 4, in which said p-type semiconductor elements and said n-type semiconductor elements are shaped into a column configuration.

6. The thermoelectric module as set forth in claim 3, in which the metal electrodes on said one of said first and second inner surfaces respectively have contact areas, and the ratio of the total contact area to said one of said first and second inner surfaces is equal to or greater than 0.75.

7. The thermoelectric module as set forth in claim 3, in which said first metal electrodes and said second metal electrodes are equal in thickness to or greater than 50 microns.

8. The thermoelectric module as set forth in claim 2, in which said semiconductor elements are arranged in a sub-area of said one of said first and second inner surfaces, and the ratio of said total area of said cross sections to said sub-area is equal to or greater than 0.45.

9. The thermoelectric module as set forth in claim 8, in which said plural thermoelectric junctions further include
   first metal electrodes formed on said first inner surface in a spaced apart configuration and selectively held in contact with first end surfaces of said semiconductor elements, and
   second metal electrodes formed on said second inner surface in a spaced apart configuration and selectively held in contact with second end surfaces of said semiconductor elements.

10. The thermoelectric module as set forth in claim 2, in which said semiconductor elements have a thermal conductivity equal to or less than 1.35 watt/(m·K).

11. A thermoelectric module comprising:
    a first electrically insulating substrate having a first inner surface, a second electrically insulating substrate having a second inner surface opposed to said first inner surface, and plural thermoelectric junctions selectively formed on said first and second inner surfaces and including electrodes arranged on said first and second inner surfaces and semiconductor elements held in contact with said electrodes and arranged in a space between a first array of the electrodes on said first inner surface and a second array of the electrodes on said second inner surface so as to produce temperature differences between said first inner surface and said second inner surface when an electrical current flows through said junctions, wherein said semiconductor elements are arranged in spaced relation to one another, and wherein the ratio of the total of said space between said semiconductor elements to said space between said first and second electrode arrays is less than 0.58.

12. A thermoelectric module comprising:

a first electrically insulating substrate having a first inner surface, a second electrically insulating substrate having a second inner surface opposed to said first inner surface, and plural thermoelectric junctions selectively formed on said first and second inner surfaces and including semiconductor elements arranged in a space over an occupation area on one of said first and second inner surfaces so as to produce temperature differences between said first inner surface and said second inner surface when an electrical current flows through said junctions, wherein the ratio of said occupation area to said one of said first and second inner surfaces is equal to or greater than 0.45, and the ratio of total cross sections of said semiconductor elements to said one of said first and second inner surfaces is equal to or greater than 0.42.

* * * * *